United States Patent [19]
Li et al.

[11] Patent Number: 5,843,518
[45] Date of Patent: *Dec. 1, 1998

[54] METHOD FOR MAKING A TANTALA/SILICA INTERFERENCE USING HEAT TREATMENT

[75] Inventors: Hongwen Li, Pittsford, N.Y.; Gautam Bandyopadhyay, Acton, Mass.; Keith A. Klinedinst, Marlboro, Mass.; Joseph E. Lester, Lincoln, Mass.

[73] Assignee: Osram Sylvania Inc., Danvers, Mass.

[ * ] Notice: The term of this patent shall not extend beyond the expiration date of Pat. No. 5,648,115.

[21] Appl. No.: 775,535

[22] Filed: Jan. 9, 1997

Related U.S. Application Data

[62] Division of Ser. No. 379,818, Jan. 27, 1995, abandoned.

[51] Int. Cl.$^6$ .............................. B05D 5/12; B05D 3/02; C23C 16/06
[52] U.S. Cl. ...................... 427/107; 427/166; 427/167; 427/255; 427/255.3; 427/255.7; 427/376.2
[58] Field of Search ..................... 427/107, 166, 427/167, 255, 255.3, 255.7, 376.2; 313/112, 580

[56] References Cited

U.S. PATENT DOCUMENTS

| | | | |
|---|---|---|---|
| 4,949,005 | 8/1990 | Parham et al. | 427/107 |
| 5,138,219 | 8/1992 | Krisl et al. | 313/112 |
| 5,412,274 | 5/1995 | Parham | 313/112 |
| 5,422,534 | 6/1995 | Dynys et al. | 313/112 |
| 5,541,470 | 7/1996 | Bandyopadhyay et al. | 313/112 |
| 5,552,671 | 9/1996 | Parham et al. | 313/112 |
| 5,569,970 | 10/1996 | Dynys et al. | 313/112 |
| 5,648,115 | 7/1997 | Bandyopadhyay et al. | 427/107 |
| 5,658,612 | 8/1997 | Li et al. | 427/107 |

*Primary Examiner*—Shrive Beck
*Assistant Examiner*—Bret Chen
*Attorney, Agent, or Firm*—Carlo S. Bessone

[57] ABSTRACT

A method for making a tantala/silica interference filter on a vitreous substrate, which filter retains integrity at temperatures in excess of 600° C., includes the steps of depositing by low pressure chemical vapor deposition a first coating of tantala/silica on the substrate, heat treating the first coating, and depositing by low pressure chemical vapor deposition a second coating of tantala/silica, the first and second coatings in combination providing a tantala/silica interference filter with a thickness of at least 3.5 microns on the vitreous substrate. There is further presented an electric lamp having an envelope and an interference filter applied thereto, in accordance with the above method.

9 Claims, 3 Drawing Sheets

```
┌─────────────────────────────────────┐
│ ON A VITREOUS SUBSTRATE DEPOSITING  │
│ BY LOW PRESSURE CHEMICAL VAPOR      │
│ DEPOSITION A FIRST COATING OF ALTER-│
│ NATING LAYERS OF $Ta_2O_5$ AND $SiO_2$ │
└─────────────────────────────────────┘
                  │
┌─────────────────────────────────────┐
│ HEAT TREATING THE FIRST COATING     │
└─────────────────────────────────────┘
                  │
┌─────────────────────────────────────┐
│ DEPOSITING ON THE FIRST COATING BY  │
│ LOW PRESSURE CHEMICAL VAPOR DEPOSI- │
│ TION A SECOND COATING OF ALTERNATING│
│ LAYERS OF $Ta_2O_5$ AND $SiO_2$     │
└─────────────────────────────────────┘
                  │
┌─────────────────────────────────────┐
│ THE FIRST AND SECOND COATINGS IN    │
│ COMBINATION PROVIDING A $Ta_2O_5/SiO_2$│
│ INTERFERENCE FILTER WITH A THICK-   │
│ NESS OF A LEAST 3.5 MICRONS         │
└─────────────────────────────────────┘
```

*FIG. 1*

METHOD FOR MAKING A TANTALA/SILICA INTERFERENCE USING HEAT TREATMENT

This application is a division of application Ser. No. 08/379,818 filed Jan. 27, 1995, which application is now abandoned.

BACKGROUND OF THE INVENTION

1. Field of the invention

This invention relates to light interference filters for lamps, and is directed more particularly to a method for making tantala/silica interference filters and to an electric lamp having such a filter thereon.

2. Description of the Prior Art

Thin film optical coatings, known as interference filters, which comprise alternating layers of two or more materials of different indices of refraction, are well known to those skilled in the art. Such coatings, or films, are used to selectively reflect or transmit light radiation from various portions of the electromagnetic radiation spectrum, such as ultraviolet, visible and infrared radiation. The films or coatings are used in the lamp industry to coat reflectors and lamp envelopes. One application in which the thin film optical coatings are useful is to improve the illumination efficiency, or efficacy, of incandescent lamps by reflecting infrared energy emitted by a filament, or arc, back to the filament or arc while transmitting the visible light portion of the electromagnetic spectrum emitted by the filament. This lowers the amount of electrical energy required to be supplied to the filament to maintain its operating temperature. In other lamp applications, where it is desired to transmit infrared radiation, such filters reflect the shorter wavelength portions of the spectrum, such as ultraviolet and visible light portions emitted by the filament or arc and transmit primarily the infrared portion in order to provide heat radiation with little or no visible light radiation. Such an application of this latter type include a typical radiant heater for use where visible radiation emitted by the heater is unwanted.

Such interference filters useful for applications where the filter will be exposed to high temperature in excess of 500° C., or so, have been made of alternating layers of tantala (tantalum pentoxide $Ta_2O_5$) and silica ($SiO_2$) wherein the silica is the low refractive index material and the tantala is the high refractive index material. Such filters, and lamps employing same, are disclosed in U.S. Pat. Nos. 4,588,923; 4,663,557 and 4,689,519. In such lamp applications, the interference filters, which are applied on the outside surface of the vitreous lamp envelope containing the filament within, often reach operating temperatures in the range of about 800°–900° C. These interference filters, or coatings, have been applied primarily using evaporation or sputtering techniques which, while capable of producing a satisfactory interference filter, have limitations with respect to not being able to apply a uniform coating to any but a flat surface. In the case of tubing used for making lamps, the tubing must be rotated in the sputtering or vacuum evaporation chamber as the coating is being applied. This technique does not lend itself to applying uniform coatings to curved objects. Moreover, this technique is rather costly.

In U.S. Pat. No. 4,949,005, issued Aug. 14, 1990, in the name of Thomas G. Parham, et al, there is described a method for the manufacture of thin film interference filters consisting of alternating layers of tantala and silica suitable for high temperature use on electric lamps. Depending upon the individual layer thickness, such filters may be designed to reflect light with wavelengths falling within a particular range, while transmitting light of other wavelengths. As described in the '005 U.S. Patent, one application of such thin film interference filters is as coatings on the vitreous envelopes of incandescent lamps, which coatings improve lamp efficiency by reflecting infrared energy emitted by the lamp filament back onto the filament, while transmitting visible light emitted by the filament. The method for the manufacture of such multilayer coatings described in U.S. Pat. No. '005 essentially involves depositing alternating layers of tantala and silica upon the surface of the lamp by low pressure chemical vapor deposition. In order to avoid the development of catastrophic stresses when the coated lamps are subsequently burned, leading to poor adhesion and poor optical properties, the coated lamps are heat treated to a temperature at least as high as the temperature of the lamp surface when the lamp is burned. Moreover, during this heat treatment process, the temperature of the coated lamp is maintained between 550° and 675° C. for a period of time ranging between 0.5 hour and 5 hours before being exposed to the higher lamp burning temperature, to control the rate of formation and growth of tantala crystallites during the heat treatment. The higher temperature is applied for 0.1–5 hours, and is at least as high as the lamp surface when the lamp is burned. During the heat treatment process, a pattern of fine randomly oriented cracks develops, resulting in a decrease in the overall, or average, stress. Random cracking is a natural consequence of high stresses in thin films. The heat treatment conditions allow cracked coatings to remain stable during lamp operation.

Parham, et al, further teaches that the coated lamps may be cooled down somewhat between the end of the coating process and the beginning of the heat treatment process. However, it has been found that the greater the total thickness of the multilayer coating, the more important it becomes to minimize the extent of cooling prior to heat treatment. More particularly, in order to avoid the buildup of catastrophic stresses within the coating, or at the lamp/coating interface, lamps with fused silica envelopes to which tantala/silica multilayer coatings with total thicknesses greater than about 3.5 microns have been applied, by low pressure chemical vapor deposition, cannot be cooled substantially below the coating temperature prior to the beginning of the thermal treatment.

Thus, if tantala/silica interference filters with thicknesses greater than about 3.5 microns, and with good optical and mechanical quality, are to be applied to fused silica lamp envelopes, either (1) the coated lamps must be heat treated within the deposition chamber (without cooling after the coating has been formed), or (2) they must be transferred without cooling to a separate heat treatment chamber preheated to a temperature close to that at which the coating deposition process is carried out, followed by initiation of the heat treatment process without substantial cooling. The first alternative, while effective, is impractical because it requires that the deposition chamber not be used to coat another set of lamps until the time consuming heat treatment process is completed, greatly reducing the throughput of coated lamps. The second alternative, while conceptually simple, is not so in practice because it requires that effective means be developed by which to transfer a relatively large and possibly delicate assembly of coated lamps between two high temperature environments without cooling during the transfer.

There is thus a need for an improved method for making a thin film optical coating interference filter upon a vitreous substrate, such as an electric lamp envelope, which coating comprises alternating layers of tantala and silica, which method results in such a coating as is well adhered to the substrate and remains so at temperatures in excess of 600° C. There is further a need for such a process as permits cooling of the coating before heat treatment thereof, to permit vacating of the deposition chamber after coating to free the chamber for coating of additional lamps. There is still further needed a lamp which is provided with such a coating which remains well adhered to the lamp surface under operating conditions.

SUMMARY OF THE INVENTION

It therefore is an object of the invention to provide a method for making a tantala/silica interference filter on a vitreous substrate, the filter retaining adherence integrity at temperatures in excess of 600° C.

A further object of the invention is to provide such a method wherein the filter may be cooled after coating and before heat treatment thereof, to permit moving the coated substrate out of the deposition chamber, with attendant cooling of the coated substrates prior to application of a heat treating process.

A still further object is to provide an electric lamp having a light transmissive vitreous envelope for enclosing an electric light source, and an interference filter on the surface of the lamp envelope and exhibiting adhesion thereto at temperatures in excess of 600° C.

With the above and other objects in view, as will hereinafter appear, a feature of the present invention is the provision of a method for making a tantala/silica interference filter on a vitreous substrate, the filter retaining integrity at temperatures in excess of 600° C., the method comprising the steps of depositing by low pressure chemical vapor deposition a first coating of tantala/silica on the substrate, heat treating the first coating, and depositing by low pressure chemical vapor deposition a second coating of tantala/silica, the first and second coatings in combination providing a tantala/silica interference filter with a thickness of at least 3.5 microns on the vitreous substrate.

In accordance with a further feature of the invention, there is provided an electric lamp comprising a light transmissive vitreous envelope for enclosing an electric light source, and an interference filter on a surface of the envelope and exhibiting adhesion thereto at temperatures in excess of 600° C. The filter comprises a first coating of alternating layers of tantala and silica, the first coating being deposited on the envelope by low pressure chemical vapor deposition and being heat treated, and a second coating of alternating layers of tantala and silica, the second coating being deposited on the first coating by low pressure chemical vapor deposition. The first and second coatings, in combination, are at least 3.5 microns thick.

The above and other features of the invention, including various novel details of construction and combinations of parts and method steps, will now be more particularly described with reference to the accompanying drawings and pointed out in the claims. It will be understood that the particular method and device embodying the invention are shown by way of illustration only and not as limitations of the invention. The principles and features of the invention may be employed in various and numerous embodiments without departing from the scope of the invention.

BRIEF DESCRIPTION OF THE DRAWINGS

Reference is made to the accompanying drawings in which is shown an illustrative embodiment of the invention, from which its novel features and advantages will be apparent:

In the drawings:

FIG. 1 is a block diagram setting forth an illustrative embodiment of the inventive method;

DESCRIPTION OF THE PREFERRED EMBODIMENT

Referring to FIG. 1, there is illustrated diagrammatically an improved process for making a tantala/silica interference filter upon a vitreous substrate, which filter is useful at temperatures in excess of 600° C. According to the improved process, a tantala/silica interference filter with a total thickness greater than about 3.5 microns is deposited by low pressure chemical vapor deposition in two different coating steps, separated by an intermediate heat treatment step. The thickness of the coating deposited in the first coating step is preferably between 2.5 and 3.5 microns. Most preferably, it is between 2.75 and 3.25 microns. The temperature of the coated vitreous substrate during the intermediate heat treatment process is maintained between 550° and 675° C. for a period of time ranging between 0.5 hour and 5 hours. If the coating is applied to the vitreous envelope of an electric lamp (e.g., a fused silica lamp envelope), a further heat treatment is applied and is carried out at a temperature at least as high as the maximum temperature of the lamp surface when the lamp is burned, and the coated vitreous substrate is maintained at that elevated temperature for 0.1–5 hours.

Following the completion of this intermediate heat treatment step, the remaining layers of the tantala/silica coating are deposited. The vitreous substrate with the completed coating may or may not be subjected to a second or final heat treatment step. The multistep coating process disclosed herein is an improvement over the prior art in that the coated electric lamp, or other coated vitreous substrate, may be cooled to a temperature lower than the coating deposition temperature and maintained at such lower temperature for a long period of time between the end of the coating step and the beginning of the subsequent heat treatment step.

Thus, while the intermediate heat treatment step may be carried out within the deposition chamber itself, it may also be performed within a separate heat treatment furnace. Further, if separate heat treatment facilities are employed, so that the low pressure chemical vapor deposition chamber may be used immediately to coat another set of lamps, the untreated coated lamps may be cooled, removed from the deposition chamber, and stored under completely arbitrary conditions prior to being transferred to the heat treatment chamber for the necessary thermal processing. In this way, completely stable tantala/silica multilayer interference filters of good optical and mechanical quality and with total thicknesses exceeding 3.5 microns may be fabricated upon the vitreous envelopes of electric lamps required to operate at high temperatures without either heat treating the coated lamps within the deposition chamber, or transferring the coated lamps to a separate heat treatment chamber preheated to a temperature close to that at which the coating deposition process is carried out.

Figure 3:
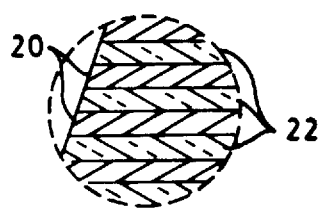
FIG. 3 is a diagrammatic representation of a magnified portion 3 of the interference filter of FIG. 2.
Figure 4:
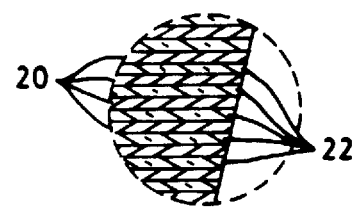
FIG. 4 is a diagrammatic representation of another magnified portion 4 of the interference filter of FIG. 2.
Figure 2:
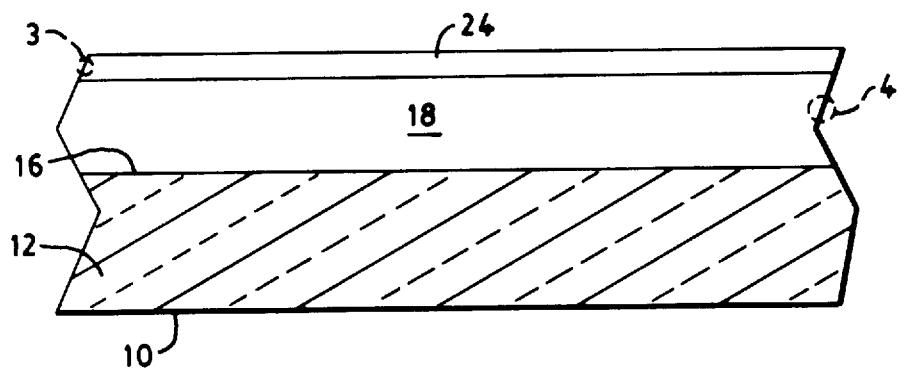
FIG. 2 is a diagrammatic representation of a portion of an electric lamp light transmissive vitreous envelope for enclosing an electric light source, and an interference filter on a surface of the envelope.
Figure 5:
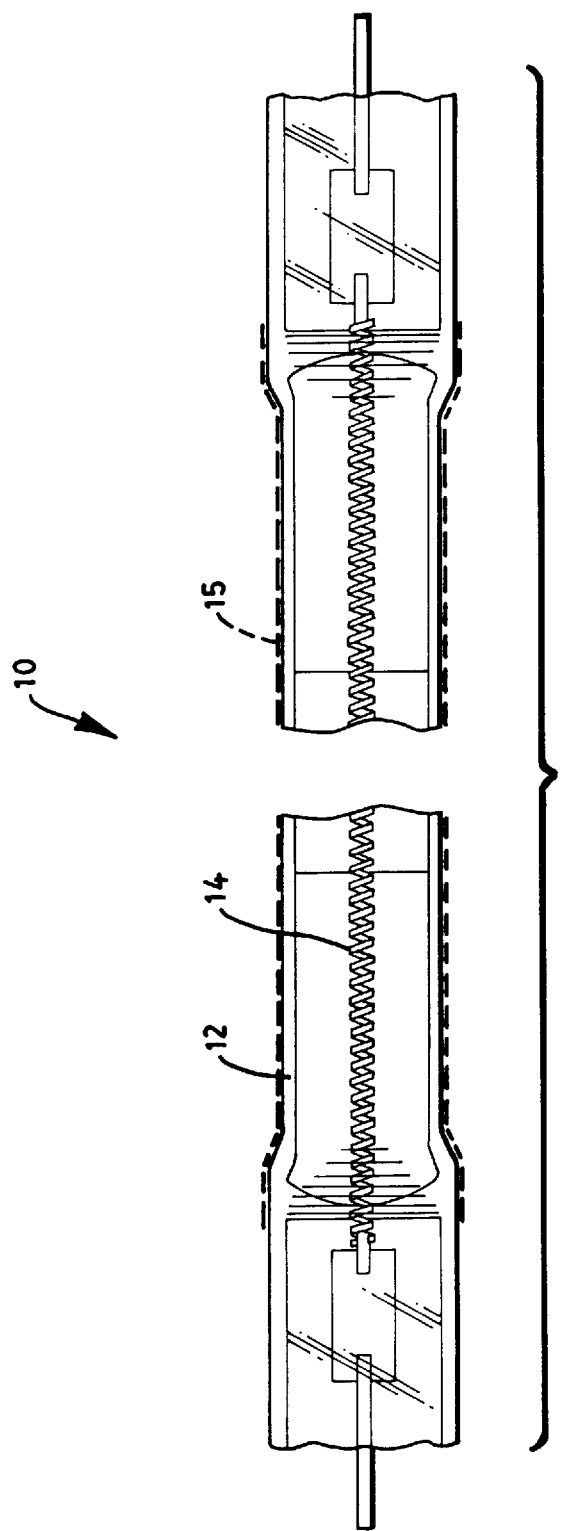
FIG. 5 is an electric lamp having an interference filter on a surface of a light transmissive vitreous envelope.

Referring to FIGS. 2–4, it will be seen that an illustrative embodiment of the invention features an electric lamp 10 comprising a light transmissive vitreous envelope 12 for enclosing an electric light source 14 (FIG. 5), and an interference filter 15 on a surface 16 of the envelope 12.

The filter comprises a first coating 18 of alternating layers of tantala 20 and silica 22, the first coating 18 being deposited on the surface 16 of the envelope 12 by low pressure chemical vapor deposition and being heat treated in accordance with the above described method. The filter further comprises a second coating 24 of alternating layers of tantala 20 and silica 22, the second coating 24 being deposited on the first coating 18 by low pressure chemical vapor deposition.

The first and second coatings 18, 24 in combination, are provided with a thickness of at least 3.5 microns. The first coating 18 is of a thickness of 2.5–3.5 microns, and preferably is of a thickness of 2.75–3.25 microns.

After application of the first coating 18, the first coating is (1) heat treated for 0.5–5.0 hours at a temperature of between 550° C. and 675° C., and (2) heat treated for an additional 0.1–5 hours, during which time the heat treatment temperature is at least as high as a maximum temperature of a surface of the lamp when the lamp is burned.

After application of the second coating 24, the combination of first and second coatings 18, 24 may be heat treated similarly to the manner in which the first coating 18 is heat treated.

The interference filter exhibits adhesion to the envelope surface 16 at temperatures in excess of 600° C. and, particularly, at maximum lamp surface temperatures.

The following examples are provided to illustrate the improved process described above and to clearly indicate the improvement over the prior art.

EXAMPLE 1

The purpose of this example is to illustrate the poor quality of tantala/silica interference filters with total thicknesses greater than about 3.5 microns applied to fused silica incandescent lamp envelopes by low pressure chemical vapor deposition and subsequently heat treated according to the method described by Parham, et al, if the coated lamps are allowed to cool between the end of the coating process and the beginning of the subsequent heat treatment process.

A 47-layer tantala/silica interference filter, designed to transmit visible light while reflecting infrared radiation, with an approximate 4 micron total thickness, was deposited by low pressure chemical vapor deposition upon the surfaces of a number of incandescent lamps with fused silica envelopes. Tantalum ethoxide and diacetoxydi-t-butoxysilane were used as chemical precursors for the high and low index coating materials, respectively, with a deposition temperature of about 465° C. The alternating layers were applied, one after the other, until the complete 47-layer filter was deposited. Then, the deposition chamber was allowed to cool, and the coated lamps were removed and transferred to a separate heat treatment chamber at ambient temperature. A photomicrograph of a representative portion of the surface of a coated lamp prior to being heat treated showed that portions of the coating had peeled or spalled from the surface of the lamp.

The coated lamps were then subjected to the following heat treatment cycle in an atmosphere of nitrogen gas containing approximately 1 percent oxygen: heated rapidly to 500° C.; then heated at an increase in temperature of 1/min to 650° C. and held at that temperature for 3 hours; then, heated at 1°/min to 800° C. and held for 1 hr. at that temperature; then cooled to room temperature at 2–3°/min. A photomicrograph of a representative portion of the surface of a coated lamp, after being so heat treated, revealed that most of the coating had peeled or spalled from the surface of the lamp.

These results demonstrate the fact that, in general, a tantala/silica multilayer interference filter of the type described, deposited upon a fused silica surface, cannot be cooled and subsequently heat treated as described in U.S. Pat. No. 4,949,005 without the buildup of catastrophic stresses which result in peeling of the coating from the vitreous substrate, or, if the bond between the coating and the substrate is strong enough, in the actual breakdown (spalling) of the vitreous material itself.

EXAMPLE 2

This example illustrates the improved process that is the subject of this invention. A 47-layer tantala/silica interference filter with the same design and overall thickness as that described in Example 1 was deposited upon the surfaces of a number of incandescent lamps with fused silica envelopes, using a low pressure chemical vapor deposition process, as described above. The alternating layers were applied, one after the other, until a total of 38 layers were deposited. The thickness of the resulting 38-layer coating was approximately 3 microns. The deposition chamber was allowed to cool, and the coated lamps were removed and transferred to a separate heat-treatment chamber at ambient temperature. A photomicrograph of a representative portion of the surface of a coated lamp prior to being heat treated revealed some visible fine cracks with no spalling or peeling of the coating.

The coated lamps were then subjected to a heat-treatment cycle identical to that described in Example 1. A photomicrograph of a representative portion of the surface of a coated lamp after being so heat treated revealed more fine cracks throughout the coating, but no peeling or spalling.

The coated and heat treated lamps were then placed back into the deposition chamber, and a final 9 layers of the 47-layer coating were deposited. After cooling, the fully coated lamps were removed from the deposition chamber, placed back into the separate heat-treatment chamber, and subjected again to the same heat-treatment cycle. Photomicrographs of representative portions of the surfaces of the fully coated lamps before and after this final heat treatment showed that the fully coated lamp survived the high-temperature heat-treatment process without any peeling or spalling of the coating from the lamp surface.

Comparing these results with those of Example 1, it is seen, first, that tantala/silica multilayer interference filters with thicknesses greater than about 3.5 microns deposited upon the surfaces of fused silica incandescent lamp envelopes, as in U.S. Pat. No. 4,949,005, suffer from buildup of catastrophic stresses which result in separation of the coating from the vitreous substrate during thermal cycling, unless the coated lamps are maintained at or near to the coating temperature between the end of the coating process and the beginning of the subsequent high-temperature heat treatment. However, use of the two-step coating process with an intermediate high-temperature heat treatment results in the formation of perfectly adherent coatings that survive subsequent temperature cycling without controlling the temperature of the coated surface between deposition and heat treatment steps.

EXAMPLE 3

This example is offered to further illustrate the improved process that is the subject of the invention. The 47-layer tantala/silica interference filter employed in the preceding two examples was applied to a number of incandescent lamps with fused silica envelopes, following the two-step coating procedure described in Example 2. After the final layer had been deposited, the deposition chamber was allowed to cool, and the coated lamps were removed and subsequently burned at 120 V for approximately 200 hours. While burning, the coated lamp surface maximum temperature exceeded 600° C. Photomicrographs of representative portions of the surface of a fully coated lamp, before and after burning, showed that the coated lamp survived the temperature cycling that occurred during lamp operation without any peeling or spalling of the coating from the surface of the lamp.

This example shows that the use of the two-step coating process, with an intermediate high-temperature heat treatment, results in the formation of perfectly adherent tantala/silica coatings with thicknesses substantially greater than 3.5 microns that survive high-temperature lamp operation without any tendency to separate from the fused silica lamp envelope.

EXAMPLE 4

This example is included to demonstrate the effect of coating thickness upon the success of the two-step coating process. A 43-layer tantala/silica interference filter designed to transmit visible light while reflecting infrared radiation, with an approximate 4.6 micron total thickness, was deposited by low pressure chemical vapor deposition upon the surfaces of a number of incandescent lamps with fused silica envelopes. As before, tantalum ethoxide and diacetoxydi-t-butoxysilane were employed as the chemical precursors for the tantala and silica layers in the low pressure chemical vapor deposition process. The heat treatments were performed in nitrogen containing about 1% oxygen, with temperature holds at 650° and 800° C., as before. Two variations of the two-step coating process were examined.

In the first case, the first 16 layers of the 43-layer filter were deposited, resulting in a coating with an approximate 2 micron thickness. Then, the deposition chamber was allowed to cool, and the coated lamps were removed and transferred to a separate heat-treatment chamber at ambient temperature. After the coated lamps were heat treated to 800° C., they were placed back into the deposition chamber, and the remaining 27 layers were deposited. After the fully coated lamps were cooled from the deposition temperature, some of the lamps were subjected to a second 800° C. heat treatment, while others were burned at 120 V for a few hours. In both cases, large portions of the coating separated from the lamp through peeling or spalling.

In the second case, the first 26 layers of the 43-layer filter were deposited, resulting in a coating with an approximate 3 micron thickness. After cooling, transferring to a separate heat-treatment chamber, and undergoing the 800° C. heat treatment, the remaining 17 layers were deposited. Then, as before, some of the fully coated lamps were subjected to a second 800° C. heat treatment, while others were burned at 120 V for at least 100 hours. In contrast to the preceding case, however, the 4.6 micron coatings, although cracked, remained solidly bonded to the lamp surfaces.

This example shows that there is a minimum tantala/silica layer thickness, in practice found to be about 2.5 microns, above which the performance of an intermediate high-temperature heat treatment, without limiting the extent of cooling of the coated substrate between coating and heat-treatment steps, is an effective means to manufacture stable multilayer interference filters on fused silica substrates with total thicknesses greater than about 3.5 microns.

Accordingly, there is provided a method for making a tantala/silica interference filter on a vitreous substrate, which method produces a filter exhibiting improved adherence to the substrate at temperatures in excess of 600° C. There is further provided such a method wherein the substrate and a first coating on the substrate may be cooled to any selected temperature for any selected length of time before application of heat treatment, without deleteriously affecting the adherence integrity. There is still further provided an electric lamp having a vitreous envelope and an interference filter on the surface of the lamp envelope, the filter exhibiting improved adhesion to the surface of the envelope at temperatures in excess of 600° C. and, in particular, at the maximum surface temperature of the lamp when burning.

It is to be understood that the present invention is by no means limited to the particular construction and method steps herein disclosed and/or shown in the drawings, but also comprises any modifications or equivalents within the scope of the claims.

What is claimed is:

1. Method for making a tantala/silica interference filter on a vitreous substrate, said filter retaining integrity at temperatures in excess of 600° C., said method comprising the steps of:

depositing by low pressure chemical vapor deposition a first coating of tantala/silica on said substrate;

heat treating said first coating; and depositing by low pressure chemical vapor deposition a second coating of tantala/silica following completion of the heat treatment of said first coating;

said first and second coatings in combination providing said tantala/silica interference filter with a thickness of at least 3.5 microns.

2. The method in accordance with claim 1 wherein said first coating is of a thickness of 2.5–3.5 microns.

3. The method in accordance with claim 1 wherein said first coating is of a thickness of 2.75–3.25 microns.

4. The method in accordance with claim 2 wherein said first coating is allowed to cool to a temperature below a coating deposition temperature at which said first coating is deposited, before starting said second coating.

5. The method in accordance with claim 2 wherein said first and second coatings each comprise alternating layers of said tantala and said silica.

6. The method in accordance with claim 5 wherein said heat treating of said first coating is conducted for 0.5–5.0 hours at a temperature maintained between 550° C.–675° C.

7. The method in accordance with claim 5 wherein said vitreous substrate comprises a vitreous envelope of a fused silica electric lamp, and said first coating is heat treated for 0.5–5.0 hours at a temperature of 550° C.–675° C. and is further heat treated for 0.1–5.0 hours at a temperature at least as high as a maximum temperature of a surface of said lamp when said lamp is burned.

8. The method in accordance with claim 7, including the further step of subjecting said first and second coatings in combination to a second heat treatment.

9. The method in accordance with claim 7 wherein said first coating comprises 38 of said alternating layers of said tantala and said silica, and said second coating comprises nine of said alternating layers of said tantala and said silica.

* * * * *